US011057989B1

(12) United States Patent
Park et al.

(10) Patent No.: US 11,057,989 B1
(45) Date of Patent: Jul. 6, 2021

(54) ADJUSTABLE MOUNT FOR CONTACTING PROBES TO A DENSE PATTERN OF PADS IN A CIRCUIT BOARD

(71) Applicant: Arista Networks, Inc., Santa Clara, CA (US)

(72) Inventors: Youngbae Park, Milpitas, CA (US); James Alden Weaver, Palo Alto, CA (US); Prasad V. Venugopal, Cupertino, CA (US)

(73) Assignee: Arista Networks, Inc., Santa Clara, CA (US)

( * ) Notice: Subject to any disclaimer, the term of this patent is extended or adjusted under 35 U.S.C. 154(b) by 0 days.

(21) Appl. No.: 16/716,438

(22) Filed: Dec. 16, 2019

(51) Int. Cl.
*H05K 1/02* (2006.01)
*G01R 31/28* (2006.01)
*G01R 1/067* (2006.01)

(52) U.S. Cl.
CPC ........... *H05K 1/0268* (2013.01); *G01R 1/067* (2013.01); *G01R 31/281* (2013.01)

(58) Field of Classification Search
CPC .................................................... H05K 1/0268
See application file for complete search history.

(56) References Cited

U.S. PATENT DOCUMENTS

| | | | | |
|---|---|---|---|---|
| 4,851,765 A | * | 7/1989 | Driller | G01R 1/067 324/756.04 |
| 2012/0105087 A1 | * | 5/2012 | Mackenzie | G01R 31/2808 324/750.03 |
| 2015/0128408 A1 | * | 5/2015 | Konrad | H05K 3/0008 29/759 |

* cited by examiner

*Primary Examiner* — Stanley Tso
(74) *Attorney, Agent, or Firm* — Chamberlain, Hrdlicka, White, Williams & Aughtry

(57) ABSTRACT

Embodiments described herein relate to a system. The system may include a base configured to be removably coupled to an electrical component. The base may include a first plurality of crossbar alignment features arranged in a first pattern. The system may also include a crossbar configured to be removably coupled to the base using a portion of the first plurality of crossbar alignment features. The crossbar may include a first plurality of adapter plate alignment features arranged in a second pattern. The system may also include an adapter plate configured to be removably coupled to the crossbar using a subset of the first plurality of adapter plate alignment features. The adapter plate may include a plurality of measurement device mounting features.

17 Claims, 15 Drawing Sheets

ADJUSTABLE MOUNT FOR CONTACTING PROBES TO A DENSE PATTERN OF PADS IN A CIRCUIT BOARD

BACKGROUND

Electrical components (e.g., circuit boards) often have locations suitable for mounting other electrical components (e.g., integrated circuitry packages). Such locations may, for example, be referred to as pads, and may provide electrical connection points between the circuit board and the attached electrical component. Electrical signals may pass between the pad locations via signal paths within the electrical component. It may be useful to test the signal path between the pad locations. However, it may be difficult for existing apparatuses (e.g., probes) to be attached to the pads in a secure, reliable, and controlled manner while also having the flexibility to be located to test the signal between any set of pad locations on the circuit board.

SUMMARY

In general, in one aspect, embodiments described herein relate to a system. In one or more embodiments, the system includes a base configured to be removably coupled to an electrical component. In one or more embodiments, the base includes a first plurality of crossbar alignment features arranged in a first pattern. In one or more embodiments, the system also includes a crossbar configured to be removably coupled to the base using a portion of the first plurality of crossbar alignment features. In one or more embodiments, the crossbar includes a first plurality of adapter plate alignment features arranged in a second pattern. In one or more embodiments, the system also includes an adapter plate configured to be removably coupled to the crossbar using a subset of the first plurality of adapter plate alignment features. In one or more embodiments, the adapter plate includes a plurality of measurement device mounting features.

Other aspects of the embodiments disclosed herein will be apparent from the following description and the appended claims.

DETAILED DESCRIPTION

Figure 1:
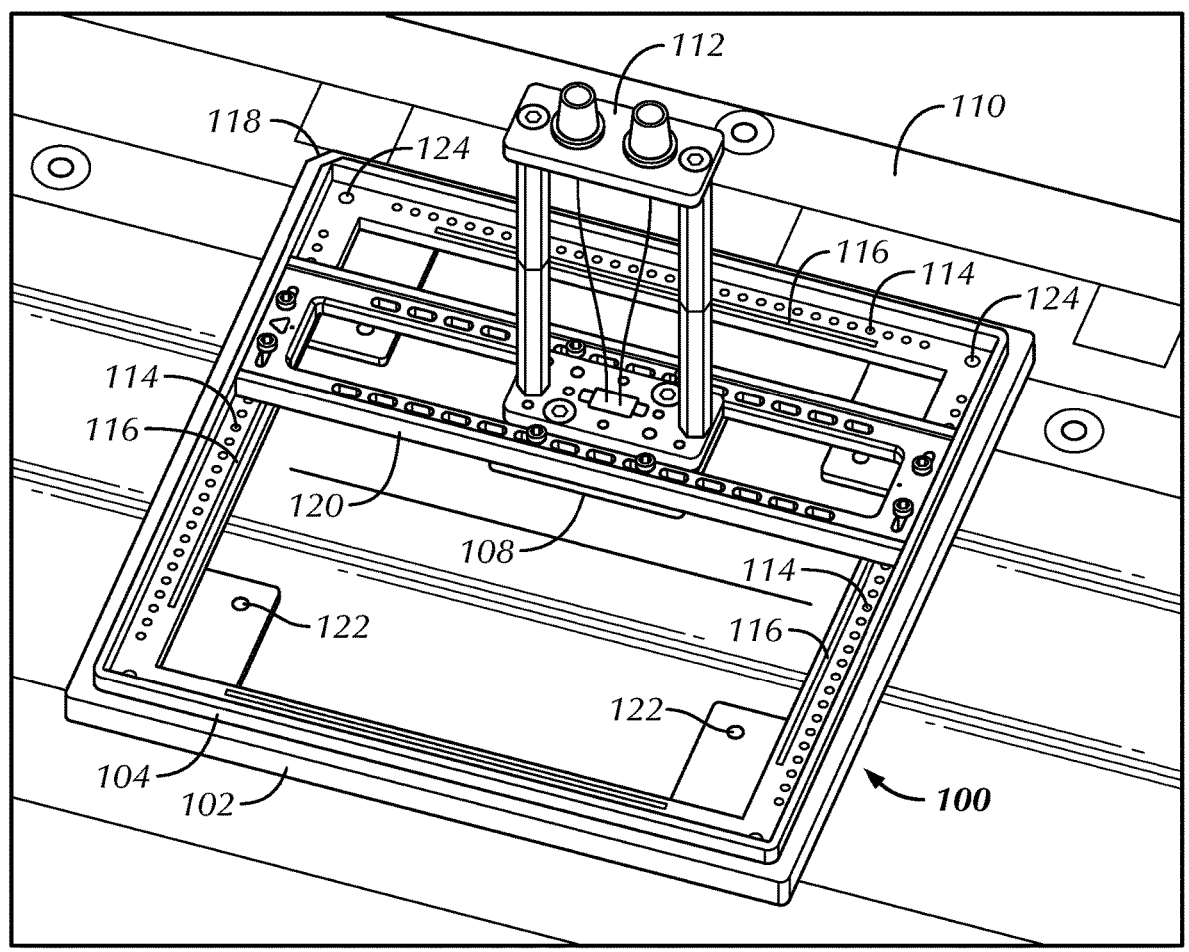
FIG. 1 shows a system in accordance with one or more embodiments described herein.

Specific embodiments will now be described with reference to the accompanying figures. In the following description, numerous details are set forth as examples. It will be understood by those skilled in the art, and having the benefit of this Detailed Description, that one or more embodiments described herein may be practiced without these specific details and that numerous variations or modifications may be possible without departing from the scope of the embodiments. Certain details known to those of ordinary skill in the art may be omitted to avoid obscuring the description.

In the following description of the figures, any component described with regard to a figure, in various embodiments, may be equivalent to one or more like-named components shown and/or described with regard to any other figure. For brevity, descriptions of these components may not be repeated with regard to each figure. Thus, each and every embodiment of the components of each figure is incorporated by reference and assumed to be optionally present within every other figure having one or more like-named components. Additionally, in accordance with various embodiments described herein, any description of the components of a figure is to be interpreted as an optional embodiment, which may be implemented in addition to, in conjunction with, or in place of the embodiments described with regard to a corresponding like-named component in any other figure.

Throughout the application, ordinal numbers (e.g., first, second, third, etc.) may be used as an adjective for an element (i.e., any noun in the application). The use of ordinal numbers is not to imply or create any particular ordering of the elements nor to limit any element to being only a single element unless expressly disclosed, such as by the use of the terms "before", "after", "single", and other such terminology. Rather, the use of ordinal numbers is to distinguish between the elements. By way of an example, a first element is distinct from a second element, and the first element may encompass more than one element and succeed (or precede) the second element in an ordering of elements.

As used herein, the phrase operatively connected, or operative connection, means that there exists between elements/components/devices a direct or indirect connection that allows the elements to interact with one another in some way. For example, the phrase 'operatively connected' may refer to any direct (e.g., wired directly between two devices or components) or indirect (e.g., wired and/or wireless connections between any number of devices or components connecting the operatively connected devices) connection.

Thus, any path through which information may travel may be considered an operative connection.

Additionally, directional words (e.g., top, bottom, above, below, right, left, x-direction, y-direction, etc.) may be used as an adjective to a noun or as a relative location of an element or component. The use of directional words is not meant to imply any required orientation within any two dimensional plane or three dimensional space. For example, the use of the words "top" and "bottom" are meant to convey relative positions (e.g., as shown in a figure), rather than any fixed position. The use of such words may instead convey a spatial relationship between a component and some other component.

In general, embodiments described herein relate to an adjustable mount for mounting electrical probes to various pad locations of a circuit board. Specifically, in one or more embodiments, a modular system of components allows for location of probe tips of a measurement device at a large variety of locations in a manner that is secure, reliable, and controlled while allowing for adjustments to place the probe tips at any of a variety of locations on the circuit board using the same apparatus. In one or more embodiments, the system is configured to allow for testing of connectivity of the circuitry and/or the signal integrity of a signal path.

In one or more embodiments, to probe the electrical circuitry of a circuit board (e.g., a printed circuit board (PCB)), a probe can be used. As an example, a circuit tester can be used by touching its probe tips to exposed circuitry such as an etched pad, solder ball or component for the debug of electrical circuitry of a PCB or a printed circuit assembly (PCA). In one or more embodiments, if the probing is used to check the signal integrity (i.e., not just simple connectivity of the circuitry) more complicated design of the probing is required to establish secure, reliable and controlled electrical connection to the probe.

In one or more embodiments, a common method used for such probing is to hold the probe in a holder that can be precisely adjusted, allowing for careful location of the probe tips. In one or more embodiments, testers often use a microscope or magnifying glass to locate the fine tip of the probe properly. Also, it may be necessary to have a slight spring loading to the fine tip of the probe so that the electrical connection can be made in a reliable manner Additionally, the location of the probe and the fixture of the setup should be done with extra caution because any unwanted movement can damage the board or probe, and also can hinder proper measurement. In one or more embodiments, the probe and contact point of a circuit board are small, making reliable contact difficult.

In some scenarios, a jig can be designed which mates the circuit board and the probe in a predefined location precisely. Such jig may provide precise and secure mating between the probe and the circuit board, but the probe mates to a predefined location dictated by the jig.

As an example, in the case of a high-speed network switching system, switch chips are implemented as a land grid array package (LGA), which may have thousands of contact points to the circuit board, and the circuit board has a grid of copper pads which meet with the contact points on the LGA. The electrical connection is made by surface mount technology (SMT). In such an example, the switch chip may have a high speed signal transfer with each pad. For validation of the design and the debugging, it may be required to measure the electrical performance of the board using a probe contacting the pads on the circuit board, prior to mounting the LGA.

As discussed above, the pad is small, and the probe tip is small. Due to electrical test requirements, the probe should be precisely located to the circuit board. However, at the same time, there are thousands of the pads in the board. In a typical test, the probes need to be located to the some of the pads, but the desired location may not be well predefined and might be defined during the test. Aligning the probe to the pad manually each time may be very time consuming, and may require extra caution, but still the probe can be easily damaged, causing the test result to be incorrect. Using a jig may solve the alignment and handling issue, but it is impractical to prepare thousands of jigs of the type shown to cover each potential measuring location. Accordingly, a solution is needed to properly connect the probe tips to the test locations that is adjustable to allow for testing of a variety of locations on a circuit board without requiring a vast quantity of jigs to facilitate the testing. In one or more embodiments, the modular implementation of embodiments described herein allow for precise placement of probe tips in any of a variety of locations of an x-y grid of possible measurement locations using the same modular apparatus without requiring the thousands of jigs that may otherwise be necessary to accomplish the goals of testing a circuit board.

FIG. 1 shows a system (100) in accordance with one or more embodiments described herein. As shown in FIG. 1, the system includes a first base component (102), a second base component (104), a crossbar (106), an adapter plate (108), an electrical component (110), a measurement device (112), first crossbar alignment features (114), second crossbar alignment features (116), an alignment feature (118), first adapter plate alignment features (120), first adapter plate alignment features (120), second base component mounting features (124), and first base component mounting features (122). Each of these components is described below.

In one or more embodiments, an electrical component (110) is any component that is capable of having electrical signal(s) traverse from one location to another location on the electrical component. In one or more embodiments, an electrical component (110) is a circuit board. In one or more embodiments, a circuit board is any structure that is configured to provide electrical connections between and/or within components (e.g., circuit components, integrated circuitry packages, etc.) that are attached in any way to the circuit board. In one or more embodiments, a circuit board may also provide mechanical support for any such components (e.g., within a computing device, network device, etc.). A non-limiting example of a circuit board is referred to as a printed circuit board (PCB).

In one or more embodiments, a computing device is any device or any set of devices that includes circuitry. Specifically, as used herein, a computing device is any device or set of devices that includes any integrated circuitry packages attached in any way to any one or more circuit boards. As an example, a computing device may be any device capable of electronically processing instructions and that includes, at least, one or more processors (e.g., integrated circuitry), any amount of volatile or non-volatile memory or storage, and/or any number of input and output device(s).

Examples of computing devices include, but are not limited to, a server (e.g., a blade-server in a blade-server chassis, a rack server in a rack, etc.), a desktop computer, a mobile device (e.g., laptop computer, smart phone, personal digital assistant, tablet computer, and/or any other mobile computing device), a network device (e.g., a multilayer switch, a router, a bridge, etc.), a storage device, a media device (e.g., televisions), and/or any other type of computing device.

Such a computing device may include any number of electrical components (110) (e.g., circuit boards), each attached to any number of integrated circuitry packages, with the circuit boards and integrated circuitry packages arranged in any configuration. As an example, computing devices often include a type of circuit board referred to as a motherboard, to which integrated circuitry packages are connected. Other circuit boards (e.g., expansion cards, daughter boards, etc.) may also be connected to a motherboard, and may further be connected to additional integrated circuitry packages. All or any portion of the collection of circuit boards and integrated circuitry packages, along with any other computing device components, may collectively operate to perform any or all of the intended function of the computing device (e.g., process network traffic).

In one or more embodiments, a circuit board includes circuit board layers (not shown). In one or more embodiments, a circuit board may include any number of layers. Each layer may have any thickness and may be constructed of any material(s).

As an example, the circuit board may be a PCB. In one or more embodiments, a PCB is a circuit board that includes a number of layers attached to one another. At least some of the layers may be conductive layers, which may be constructed from any conductive material, and which may be separated from one another by any number of non-conductive layers (e.g., a substrate) of any non-conductive material. One non-limiting example of a conductive material within a conductive layer is copper. One non-limiting example of a non-conductive material in a non-conductive layer is fiber glass. Other types of conductive and/or non-conductive materials may be included in circuit board layers without departing from the scope of embodiments described herein.

The layers of a circuit board may include any number of other layers of any type. For example, the circuit board may have a top layer that may be referred to as a solder mask or solder resist, which functions to help prevent shorts between solder locations at which integrated circuitry packages are attached to the circuit board. As another example, a PCB may include a layer, such as a silkscreen layer, on top of the solder mask layer that includes, for example, printed information relating to identification of components and/or locations on the circuit board.

In one or more embodiments, within conductive layers of the circuit board are conductive traces (not shown), which provide at least a portion of signal propagation paths through which electricity may propagate from one portion of the circuit board to another within the conductive layer. In one or more embodiments, a signal propagation path is a conductive path through which electricity propagates. There may be any number of such traces in any conductive layer of a circuit board.

In one or more embodiments, the circuit board traces operate as wires that are fixed in place within a given conductive layer of a circuit board. In one or more embodiments, the traces are separated from other portions of the conductive layer and/or from portions of other conductive layers via an insulator (e.g., air, fiber glass, etc.). In one or more embodiments, other portions within a conductive layer of a circuit board are used for any other purpose, such as, for example, electromagnetic shielding.

Circuit board traces may provide at least a portion of a signal propagation path for any type of electrical signal. Examples of such electrical signals include, but are not limited to, power signals, ground signals, or any signal that conveys any information, or any portion of any information. For example, a signal may be a signal that alternates between a higher and lower level of signal (e.g., two voltage levels), which may be interpreted as a binary signal and that conveys some form of information. As another example, the signal may be an analog signal, in which some signal feature (voltage, current, phase, etc.) may be used to convey potentially changing information (e.g., pressure, velocity, temperature, etc.). As another example, two or more signals may be paired together, with the information being conveyed to a receiver by a relative difference between one or more signal properties of the signals.

In one or more embodiments, though not shown in FIG. 1 for the sake of clarity, the electrical component has a grid (i.e., an array) of contact points arranged in a specific pattern, that allow for making an electrical connection to the electrical component (e.g., by an integrated circuitry package, a probe, etc.)

In one or more embodiments, the first base component (102) is any component of any shape and material that is configured to be removably coupled to an electrical component (e.g., a circuit board). In one or more embodiments, the first base component (102) is constructed of a conductive material, such as a metal (e.g., aluminum). In one or more embodiments, the first base component (102) includes first base component mounting features (122). In one or more embodiments, first base component mounting features (122) are configured to allow the mounting of the system (100), and more specifically the first base component (102), to the electrical component (110). For example, as shown in FIG. 1, first base component mounting features (122) may be tabs in which holes are located to allow for insertion of a member that allows the first base component (102) to be removably coupled to an electrical component (110). For example, the holes may be screw holes that allow for insertion of a screw that screws into electrical component mounting features (discussed further in the description of FIG. 2, below). Such a screw may secure the first base component (102) to the electrical component (110).

In one or more embodiments, the system (100) also includes a second base component (104). In one or more embodiments, a second base component (104) is any component of any shape and material that is configured to be removably coupled to the first base component (102). In one or more embodiments, the second base component (104) is constructed of a conductive material, such as a metal (e.g., aluminum). In one or more embodiments, the second base component (104) is removably coupled to the first base component (102) using second base component mounting features (124). In one or more embodiments, the second base component mounting features (124) are configured to align with corresponding features on the first base component (102). For example, the second base component mounting features (124) may be screw holes that align with corresponding screw holes of the first base component (102), thereby allowing the second base component (104) to be removably coupled to the first base component (102) using a set of screws of an appropriate size.

In one or more embodiments, the second base component (104) includes first crossbar alignment features (114). In one or more embodiments, the first crossbar alignment features (114) are configured to allow a crossbar (106) (discussed below) to be removably coupled to the second base component (104). For example, the first crossbar alignment features (114) may be screw holes into which screws may be screwed to couple a crossbar (106) to the second base component (104).

In one or more embodiments, the second base component (104) includes second crossbar alignment features (116). In one or more embodiments, the second crossbar alignment features (116) are smaller holes than the first crossbar alignment features (114), and may allow for members (e.g., pins) to be inserted in the second crossbar alignment features (116) and into corresponding holes in a crossbar (106) to allow for a more fine grained alignment of the crossbar (106) with pad locations of an electrical component (110) (e.g., a circuit board). In one or more embodiments, the combination of the first crossbar alignment features (114) and the second crossbar alignment features (116) allow for precisely placing the crossbar (106) in a location that allows for probe tip placement at locations where testing of a signal propagation path is desired. In one or more embodiments, the first and/or second crossbar alignment features (114, 116) are spaced at an interval that is related (e.g., the same) to the spacing of the locations on the electrical component (110) between which an electrical signal may propagate (i.e., a signal propagation path).

In one or more embodiments, the system (100) includes a crossbar (106). In one or more embodiments, a crossbar (106) is a structure configured to cross from one side of the base components (102, 104) to the other side of the base components. As shown in FIG. 1, the crossbar (106) spans from the left side of the second base component (104) to the right side of the second base component. However, one having ordinary skill in the art, and the benefit of this Detailed Description, will appreciate that the crossbar (106) could instead span from the top of the second base component (104) to the bottom of the second base component (104) (i.e., perpendicular to the orientation shown in FIG. 1). In one or more embodiments, when the base components (102, 104) have sides of substantially the same length, the same crossbar (106) may be used in either direction, as the length necessary to span from one side to the other is the same. In one or more embodiments, a crossbar (106) is constructed in any shape using any material, and is configured to be removably coupled to the second base component (104). In one or more embodiments, the crossbar (106) is constructed of a conductive material, such as a metal (e.g., aluminum).

In one or more embodiments, the crossbar (106) includes first adapter plate alignment features (120). In one or more embodiments, the first adapter plate alignment features (120) are configured to allow an adapter plate (108) (discussed below) to be removably coupled to the crossbar. For example, the first adapter plate alignment features (120) may be screw holes into which screws may be screwed to couple an adapter plate (108) to a crossbar (106). Although not shown in FIG. 1, the crossbar (106) may further include second adapter plate alignment features. In one or more embodiments, the second adapter plate alignment features are smaller holes than the first adapter plate alignment features (120), and may allow for members (e.g., pins) to be inserted in the second adapter plate alignment features and into corresponding holes in an adapter plate (108) to allow for a more fine grained alignment of the alignment plate (108) with pad locations of an electrical component (110).

In one or more embodiments, the combination of the first adapter plate alignment features (120) and the second adapter plate alignment features (not shown) allow for precise placement of the adapter plate (108) in a location that allows for probe tip placement at locations where testing of a signal propagation path is desired. In one or more embodiments, the first and/or second adapter plate alignment features are spaced at an interval that is related (e.g., the same) to the spacing of the locations on the electrical component between which an electrical signal may propagate (i.e., a signal propagation path).

In one or more embodiments, the system (100) includes an adapter plate (108). In one or more embodiments, an adapter plate (108) is a structure configured to span from one side of the crossbar (106) to the other side of the crossbar. In one or more embodiments, an adapter plate (108) is constructed in any shape using any material, and is configured to be removably coupled to the crossbar using the first and second adapter plate alignment features to position the adapter plate at a location along the crossbar relative to contact points of the electrical component between which a signal path is to be tested. In one or more embodiments, the adapter plate (108) is constructed of a conductive material, such as a metal (e.g., aluminum).

In one or more embodiments, the system (100) is coupled to a measurement device (112). In one or more embodiments, a measurement device (112) is any device capable of measuring electrical properties (e.g., connectivity, signal integrity, etc.) of a signal path between two contact points of an electrical component (110). In one or more embodiments, the measurement device (112) includes two probe tips configured to make contact with contact points of the electrical component (110). In one or more embodiments, the measurement device (112) is oriented substantially perpendicular to the electrical component (110), which may help avoid damage to the probe tips of the measurement device. In one or more embodiments, the probe tips of the measurement device (112) are spring-loaded to help ensure proper contact with the contact points of the electrical component (110). In one or more embodiments, the measurement device (112) is removably coupled to the adapter plate (108). For example, the measurement device (112) may include a bottom portion configured with one or more screw holes that correspond to screw holes in the adapter plate (108) by which the measurement device (112) may be secured to the adapter plate (108) using one or more screws. In one or more embodiments, as shown in FIG. 1, a measurement device (112) includes features that allow for connecting additional measurement (e.g., multimeter) related equipment to the measurement device (112).

While FIG. 1 shows a configuration of components, other configurations may be used without departing from the scope of embodiments described herein. Accordingly, embodiments disclosed herein should not be limited to the configuration of components shown in FIG. 1.

Figure 2:
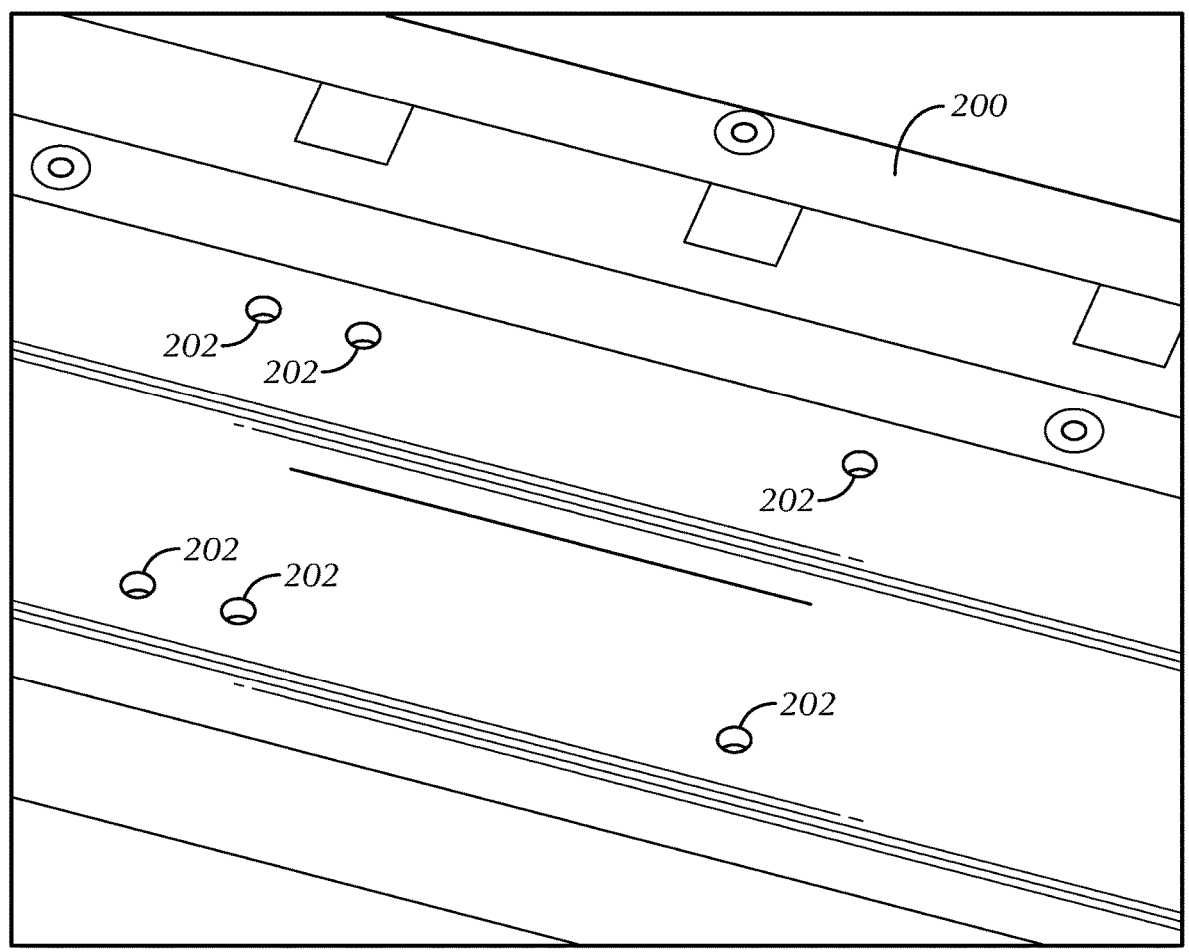
FIG. 2 shows mounting features in accordance with one or more embodiments described herein.

FIG. 2 shows an electrical component (200) in accordance with one or more embodiments described herein. As shown in FIG. 2, the electrical component (200) includes electrical component mounting features (202). To avoid obscuring the electrical component mounting features (202), the grid of contact points of the electrical component (200) are not shown in FIG. 2. In one or more embodiments, the electrical component mounting features (202) are configured to allow a base, or portion thereof (e.g., first base component (102) of FIG. 1), to be removably coupled to the electrical component (200). In one or more embodiments, the electrical component mounting features (202) are holes into which members may be inserted to secure a base, or portion thereof, to the electrical component (200). In one or more embodiments, the electrical component mounting features (202) are screw holes to allow the use of screws to removably couple the base, or portion thereof, to the electrical component (200). In one or more embodiments, the electrical component mounting features (202) are holes for inserting pegs that are part of a base, or portion thereof. Other types of attachment recesses may be used without departing from the scope of embodiments described herein. As a non-limiting example, the electrical component mounting features (202) may be heat sink holes that are intended to allow one or more heat sinks to be coupled to the electrical component (200). There may be any number of electrical component mounting features (202) on the electrical component at any location.

While FIG. 2 shows a configuration of components, other configurations may be used without departing from the scope of embodiments described herein. Accordingly, embodiments disclosed herein should not be limited to the configuration of components shown in FIG. 2.

Figure 3:
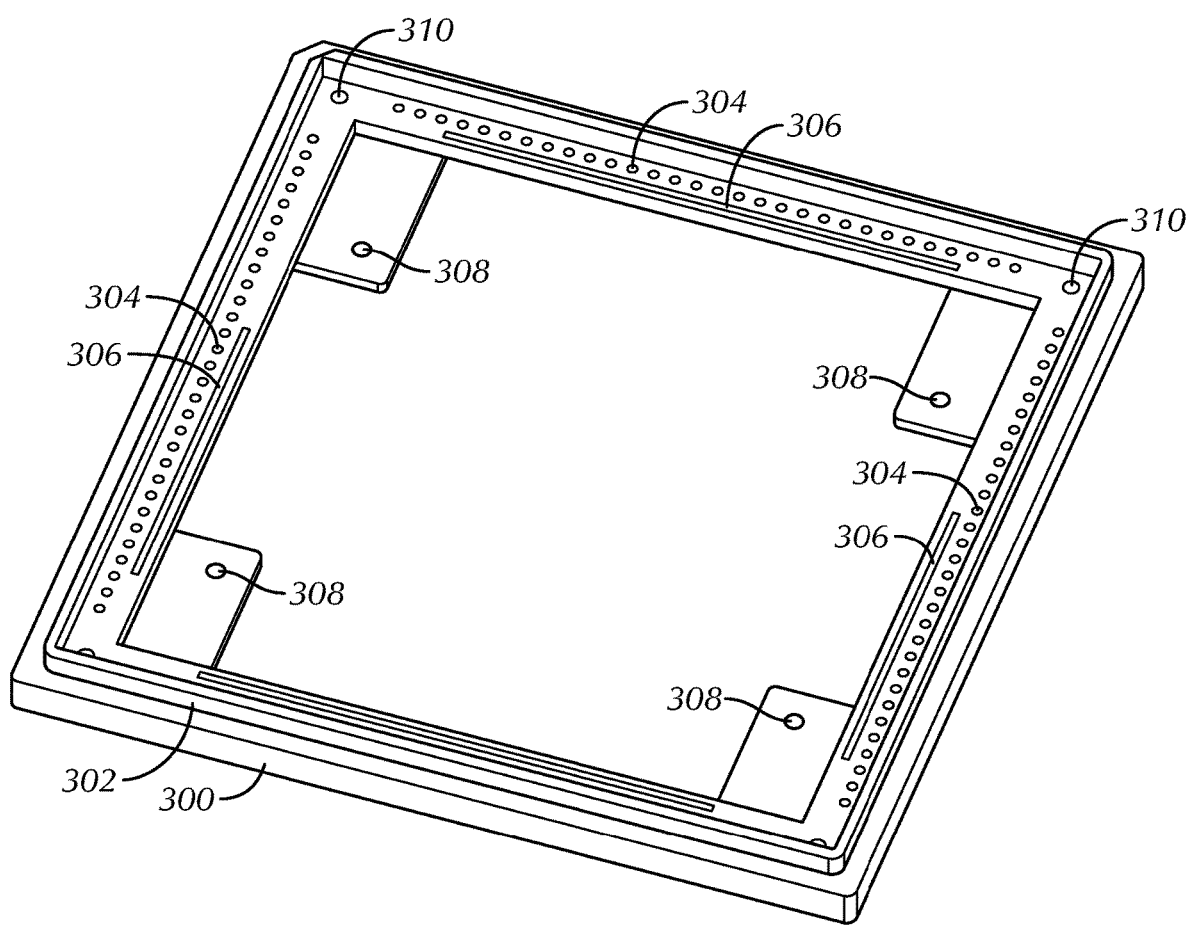
FIG. 3 shows base components in accordance with one or more embodiments described herein.

FIG. 3 shows a base in accordance with one or more embodiments described herein. Other components of the system to which the base belongs are not shown in FIG. 3 in order to more clearly show the base. As shown in FIG. 3, the base includes a first base component (300) that is substantially similar to the first base component discussed above in the description of FIG. 1. As such, in one or more embodiments, the first base component (300) is configured to be removably coupled to an electrical component (not shown) using first base component mounting features (308) (e.g., screws, pegs, etc.). Only one first base component mounting feature (308) is called out in FIG. 3 for the sake of clarity. However, as shown in FIG. 3, the first base component (300) has four such first base component mounting features (308), located near the inner corners of the first base component (300). One having ordinary skill in the art and the benefit of this Detailed Description, will appreciate that the first base component (300) may have any number of first base component mounting features (308) for mounting the first base component (300) to the electrical component (not shown) without departing from the scope of embodiments described herein.

In one or more embodiments, the first base component (300) is also configured to be removably coupled to the second base component (302) using second base component mounting features (310). In one or more embodiments, the second base component mounting features (310) are substantially similar to the second base component mounting features (124) discussed above in the description of FIG. 1. As such, in one or more embodiments, the second base component mounting features (310) are holes that correspond positionally to holes in the first base component (300), and allow for the use of members (e.g., screws) inserted into the holes to removably couple the second base component (302) to the first base component (300). In one or more embodiments, the second base component (302) includes first crossbar alignment features (304). In one or more embodiments, the first crossbar alignment features (304) shown in FIG. 3 are substantially similar to the first crossbar alignment features (114) discussed above in the description of FIG. 1. As such, the first crossbar alignment features (304) may be a series of holes whose positioning is designed to allow accurate placement of a crossbar (not shown) relative to contact points on an electrical component (not shown).

In one or more embodiments, the second base component (302) includes second crossbar alignment features (306). In one or more embodiments, the second crossbar alignment features (306) shown in FIG. 3 are substantially similar to the second crossbar alignment features (116) discussed above in the description of FIG. 1. As such, the second crossbar alignment features (306) may be a series of holes whose positioning is designed to allow accurate placement of a crossbar (not shown) relative to contact points on an electrical component (not shown). In one or more embodiments, the second crossbar alignment features (306) are smaller than the first crossbar alignment features, and are placed closer together, which may allow, when used in conjunction with the first crossbar alignment features, for more fine-grained placement of the crossbar relative to contact points on an electrical component.

While FIG. 3 shows a configuration of components, other configurations may be used without departing from the scope of embodiments described herein. Accordingly, embodiments disclosed herein should not be limited to the configuration of components shown in FIG. 3.

Figure 4:
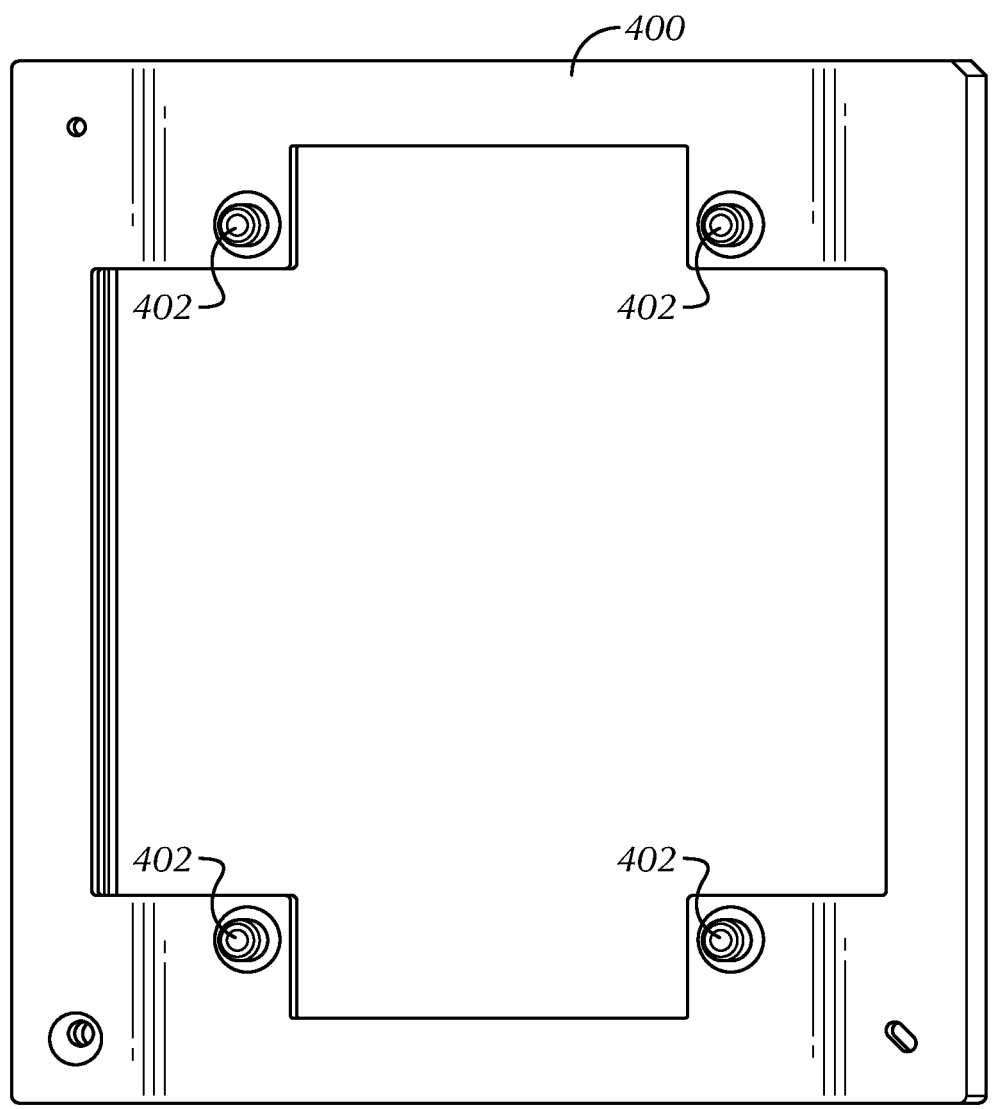
FIG. 4 shows electrical component coupling features in accordance with one or more embodiments described herein.

FIG. 4 shows the reverse side of a base (400) in accordance with one or more embodiments described herein. Although FIG. 4 shows a single base (400) piece, which may exist in some embodiments, the base (400) shown in FIG. 4 may be a first base component, as described above in the descriptions of FIG. 1 and FIG. 3. As shown in FIG. 4, the base (400) includes electrical component coupling features (402). In one or more embodiments, as shown in FIG. 4, the electrical component coupling features (402) are pegs. In such embodiments, the pegs may be configured to be inserted into electrical component mounting features (not shown), such as electrical component mounting features (202) shown in FIG. 2. While FIG. 4 shows the electrical component coupling features (402) as pegs, one having ordinary skill in the art and the benefit of this Detailed Description, will appreciate that any other form of electrical component coupling features (402) capable of securing a base (400), or portion thereof, to an electrical component (not shown) may be used without departing from the scope of embodiments described herein. For example, the electrical component coupling features (402) may be openings into which screws may be inserted to screw the base (400), or portion thereof, to the electrical component.

While FIG. 4 shows a configuration of components, other configurations may be used without departing from the scope of embodiments described herein. Accordingly, embodiments disclosed herein should not be limited to the configuration of components shown in FIG. 4.

Figure 5:
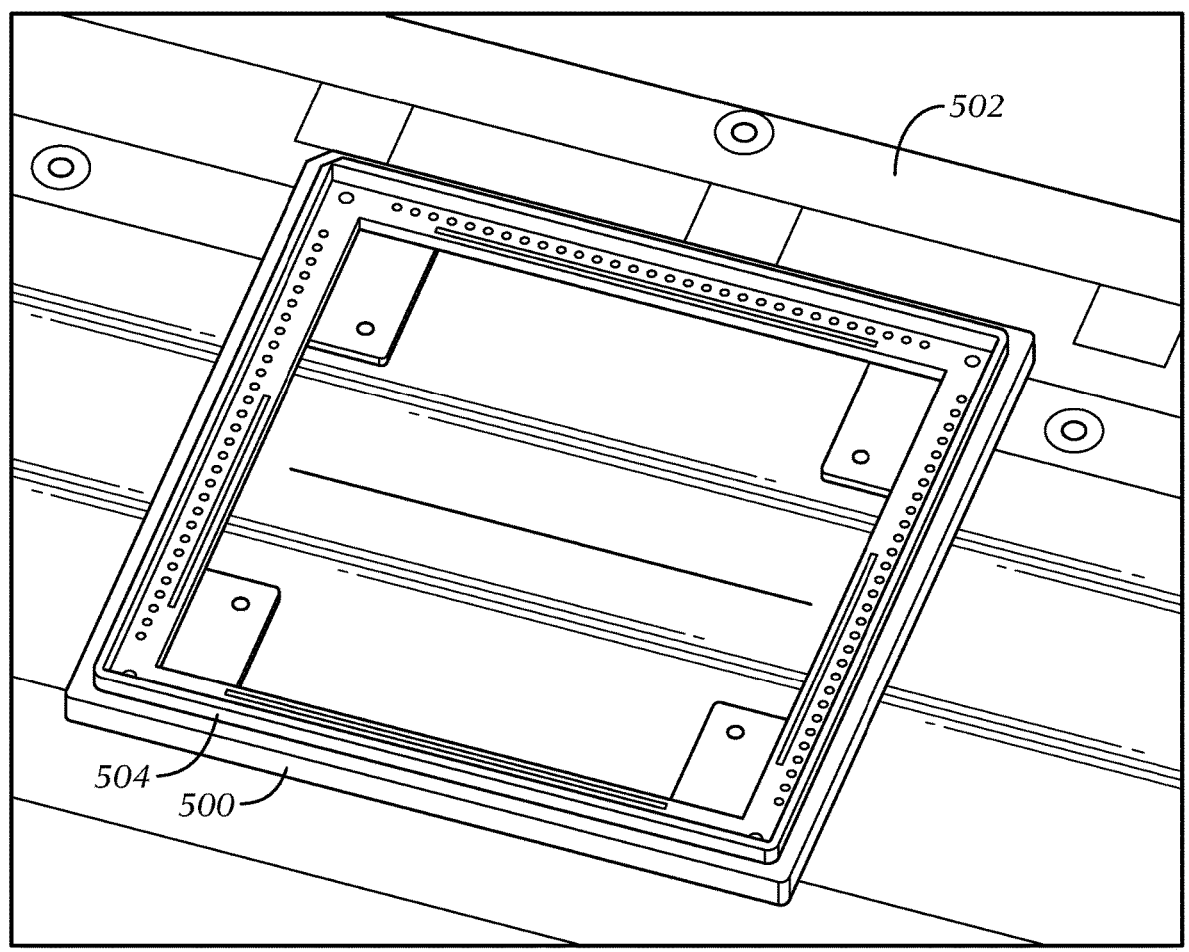
FIG. 5 shows base features in accordance with one or more embodiments described herein.

FIG. 5 shows a base having a first base component (500) and a second base component (504) mounted to an electrical component (502). For the sake of clarity, the contact points of the electrical component (502) are not shown in FIG. 5. Similarly, for the sake of clarity, FIG. 5 does not show the members that are used to secure the base to the electrical component (502). In the embodiment shown in FIG. 5, the first base component mounting features are shown as holes. In such embodiments, screws inserted from the rear of the electrical component (502) may be used to screw into the first base component mounting features to secure the base to the electrical component.

While FIG. 5 shows a configuration of components, other configurations may be used without departing from the scope of embodiments described herein. Accordingly, embodiments disclosed herein should not be limited to the configuration of components shown in FIG. 5.

Figure 6:
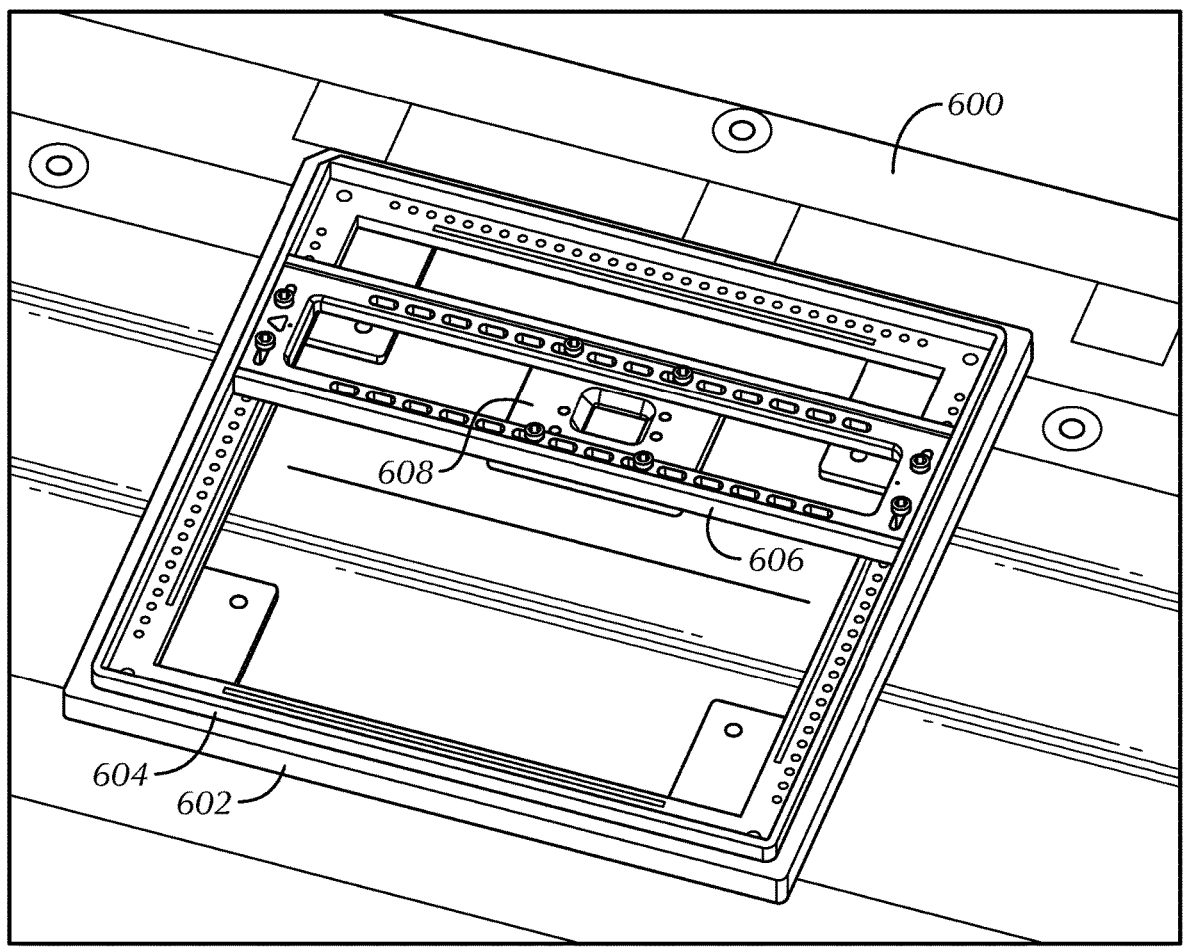
FIG. 6 shows base components with a crossbar and adapter plate in accordance with one or more embodiments described herein.

FIG. 6 shows a crossbar (606) counted to a second base component (604) and an adapter plate (608) mounted to the crossbar (606) in accordance with one or more embodiments described herein. As shown in FIG. 6, the portion of the system shown includes an electrical component (600), a first base component (602), a second base component (604), a crossbar (606), and an adapter plate (608). Each of these components is described below.

The electrical component (600), the first base component (602), the second base component (604), the crossbar (606), and the adapter plate (608) shown in FIG. 6 are substantially similar to like named components described above. FIG. 6 is intended to show these components assembled to be removably coupled to one another in accordance with one or more embodiments.

As shown in FIG. 6, the first base component (602) is removably coupled to the electrical component (600) using the first base component mounting features coupled to the electrical component mounting features. Also as shown in FIG. 6, the first base component (602) is removably coupled to the second base component (604) using the second base component mounting features (not shown) coupled to corresponding features on the first base component (602). For the sake of clarity, members providing such couplings, such as screws, are not shown in FIG. 6.

In one or more embodiments, the crossbar (606) is coupled to the second base component (604) using the first crossbar alignment features, with screws being shown as the member, in this particular embodiment, as the items used to provide the said coupling. Specifically, the screws are inserted into holes in the crossbar (606) and screwed into the first crossbar alignment features to secure the crossbar (606) to the second base component (604).

In one or more embodiments, the adapter plate (608) is coupled to the crossbar (606) using the first adapter plate alignment features, with screws being shown as the member, in this particular embodiment, as the items used to provide the said coupling. Specifically, the screws are inserted into the first adapter plate alignment features and screwed into corresponding features on the adapter plate to secure the adapter plate (608) to the crossbar (606).

While FIG. 6 shows a configuration of components, other configurations may be used without departing from the scope of embodiments described herein. Accordingly, embodiments disclosed herein should not be limited to the configuration of components shown in FIG. 6.

Figure 7:
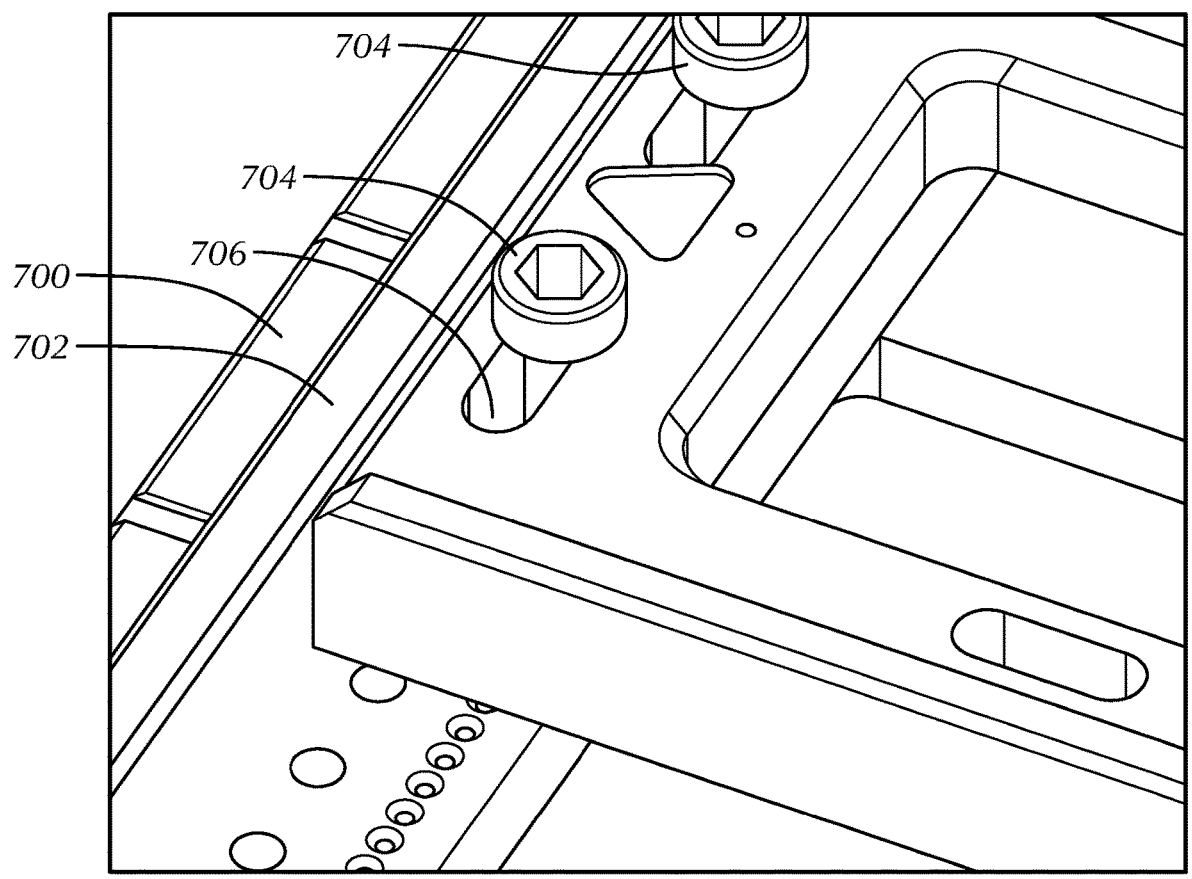
FIG. 7 shows a perspective view of base components with attachment members in accordance with one or more embodiments described herein.

FIG. 7 shows a closer view of the coupling of the crossbar to the second base component (702) in accordance with one or more embodiments described herein. Specifically, FIG. 7 shows a portion of a first base component (700), which is coupled to a second base component (702). FIG. 7 also shows the crossbar-to-base members (704) used to removably couple the crossbar to the second base component (702). In the embodiment shown in FIG. 7, the crossbar-to-base member (704) is shown as a screw. Other types of coupling members may be used without departing from the scope of embodiments described herein. Also as shown in FIG. 7, each opening in the crossbar through which the crossbar-to-base member (704) is inserted is shown as having a shape with two distal ends (706). The shape of the opening is shown as such to illustrate that the crossbar-to-base member (704) may be positioned at any location within said opening, allowing for flexible adjustment of the position of the crossbar to better align with the underlying first crossbar alignment features of the second base component.

While FIG. 7 shows a configuration of components, other configurations may be used without departing from the scope of embodiments described herein. Accordingly, embodiments disclosed herein should not be limited to the configuration of components shown in FIG. 7.

Figure 8:
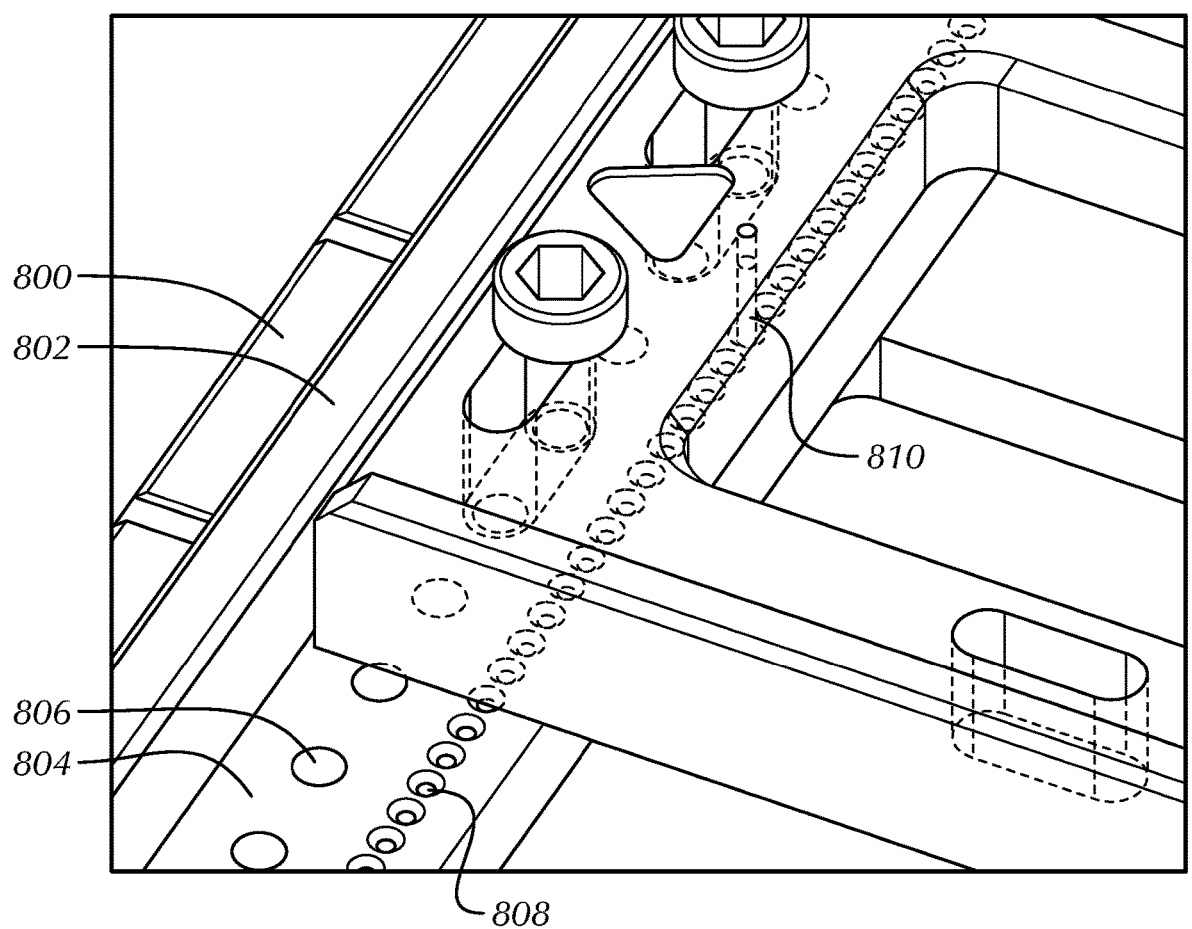
FIG. 8 shows a perspective view of base components with attachment members in accordance with one or more embodiments described herein.

FIG. 8 shows another closer view of the coupling of the crossbar (804) to the second base component (802) in accordance with one or more embodiments described herein. Specifically, FIG. 8 shows a transparent view of the crossbar (804), thereby revealing the second crossbar alignment features (808) in the second base component (802), which is coupled to the first base component (800). In one or more embodiments, the second crossbar alignment features (808) are smaller and placed close to one another than the first crossbar alignment features (806). In one or more embodiments, a crossbar alignment member (810) (e.g., a cylindrical pin) is placed with one end within at least one of the second crossbar alignment features (808), and the other end within corresponding features in the crossbar (804) itself. Such second crossbar alignment features (808) may allow for more fine-grained placement of the crossbar (804) relative to the contact points of the electrical component (not shown) to which the first base component (800) is mounted.

While FIG. 8 shows a configuration of components, other configurations may be used without departing from the scope of embodiments described herein. Accordingly, embodiments disclosed herein should not be limited to the configuration of components shown in FIG. 8.

Figure 9:
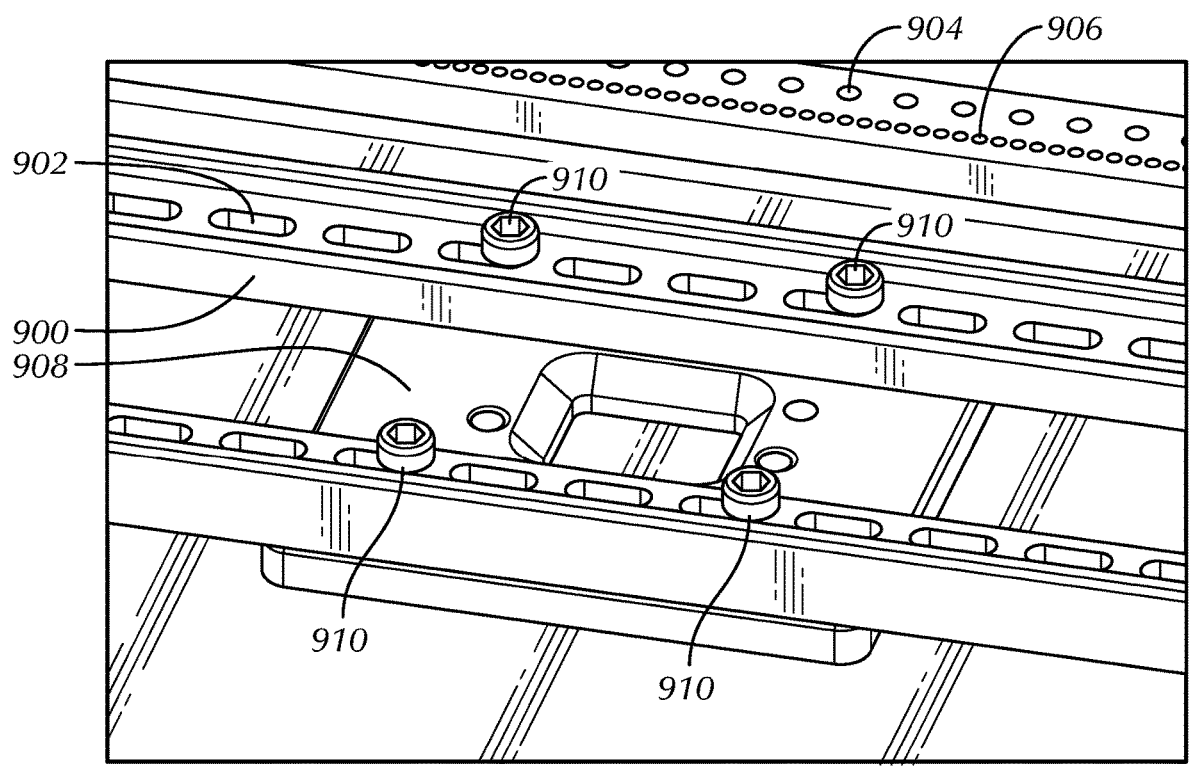
FIG. 9 shows a perspective view of a crossbar and adapter plate with attachment members in accordance with one or more embodiments described herein.

FIG. 9 shows a closer view of the coupling of the adapter plate (908) to the crossbar (900) in accordance with one or more embodiments described herein. Specifically, FIG. 9 shows a portion of a crossbar (900), which is coupled to an adapter plate (908). FIG. 9 also shows the adapter plate-to-crossbar members (910) used to removably couple the adapter plate (908) to the crossbar (900). In the embodiment shown in FIG. 9, the adapter plate-to-crossbar members (910) are shown as screws. Other types of coupling members may be used without departing from the scope of embodiments described herein. Also as shown in FIG. 9, each opening in the crossbar (900) through which the adapter plate-to-crossbar members (910) are inserted is shown as having a shape with two distal ends. The shape of the opening is shown as such to illustrate that the adapter plate-to-crossbar member (910) may be positioned at any location within said opening, allowing for flexible adjustment of the position of the adapter plate (908) to better align with the underlying first adapter plate alignment features (902) of the crossbar. FIG. 9 also shows a portion of the first crossbar alignment features (904) and the second crossbar alignment features (906), which are discussed in greater detail above.

While FIG. 9 shows a configuration of components, other configurations may be used without departing from the scope of embodiments described herein. Accordingly, embodiments disclosed herein should not be limited to the configuration of components shown in FIG. 9.

Figure 10:
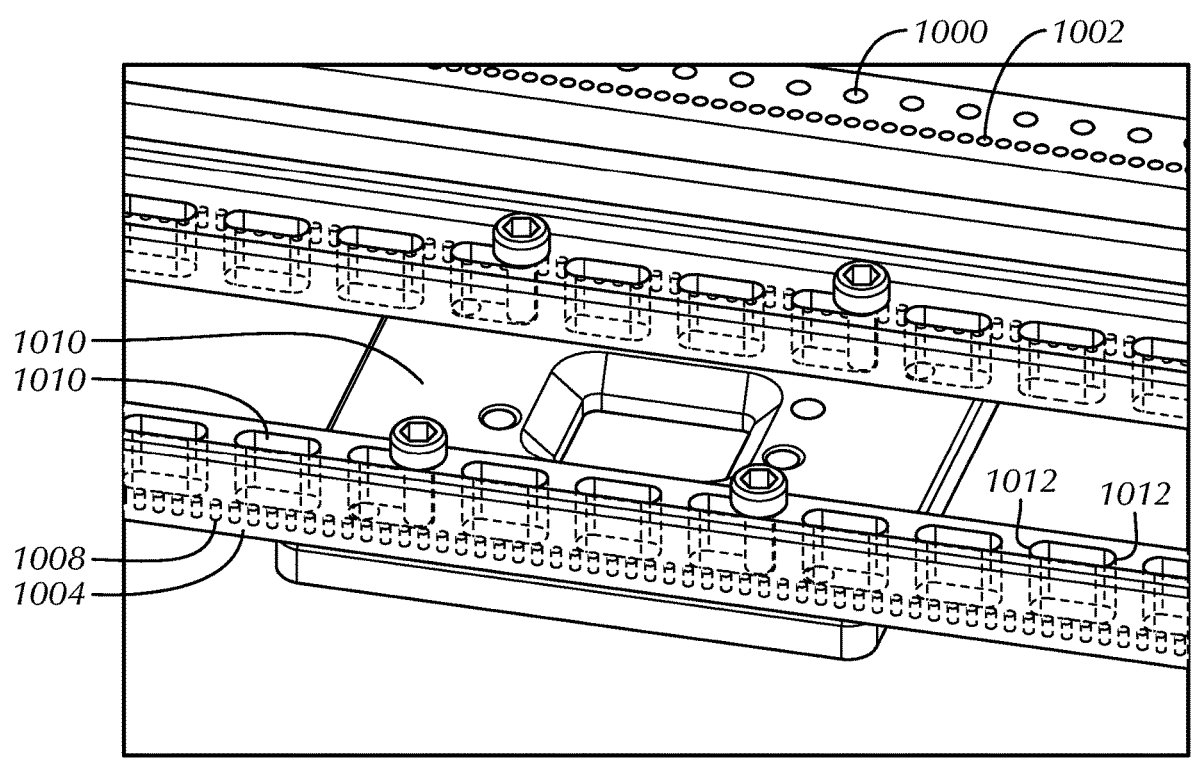
FIG. 10 shows a perspective view of a crossbar and adapter plate with attachment members in accordance with one or more embodiments described herein.

FIG. 10 shows another closer view of the coupling of the adapter plate (1006) to the crossbar (1004) in accordance with one or more embodiments described herein. Specifically, FIG. 10 shows a transparent view of the crossbar (1004), thereby revealing the coupling, via the first adapter plate alignment features (1010) of the crossbar (1004), the adapter plate (1006) to the crossbar (1004) via the adapter plate-to-crossbar members. Also shown again are the second adapter plate alignment features (1008), the first crossbar alignment features (1000), the second crossbar alignment features (1002), and the distal ends of the first adapter plate alignment features (1012).

While FIG. 10 shows a configuration of components, other configurations may be used without departing from the scope of embodiments described herein. Accordingly, embodiments disclosed herein should not be limited to the configuration of components shown in FIG. 10.

Figure 11:
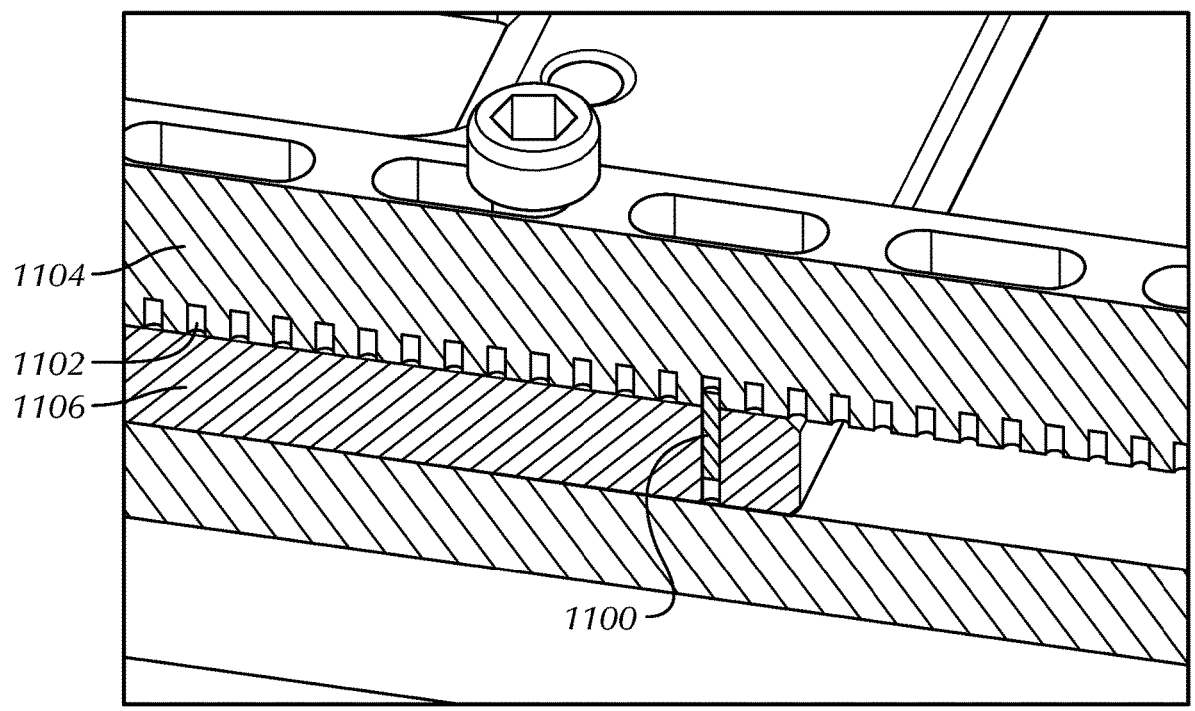
FIG. 11 shows a perspective view of adapter plate alignment features in accordance with one or more embodiments described herein.

FIG. 11 shows another closer view of the coupling of the adapter plate (1106) to the crossbar in accordance with one or more embodiments described herein. FIG. 11 again shows the crossbar, the adapter plate (1106), the first adapter plate alignment features, and the second adapter plate alignment features (1102). Specifically, FIG. 10 shows the second adapter plate alignment features (1102) in the crossbar, which is coupled to the adapter plate (1106). In one or more embodiments, the second adapter plate alignment features (1102) are smaller and placed close to one another than the first adapter plate alignment features. In one or more embodiments, an adapter plate alignment member (1100) (e.g., a cylindrical pin) is placed with one end within the second adapter plate alignment features (1102), and the other end within corresponding features in the adapter plate (1106) itself. Such second adapter plate alignment features (1102) may allow for more fine-grained placement of the adapter plate (1106) relative to the contact points of the electrical component (not shown) to which the first base component is mounted.

While FIG. 11 shows a configuration of components, other configurations may be used without departing from the scope of embodiments described herein. Accordingly, embodiments disclosed herein should not be limited to the configuration of components shown in FIG. 11.

Figure 12:
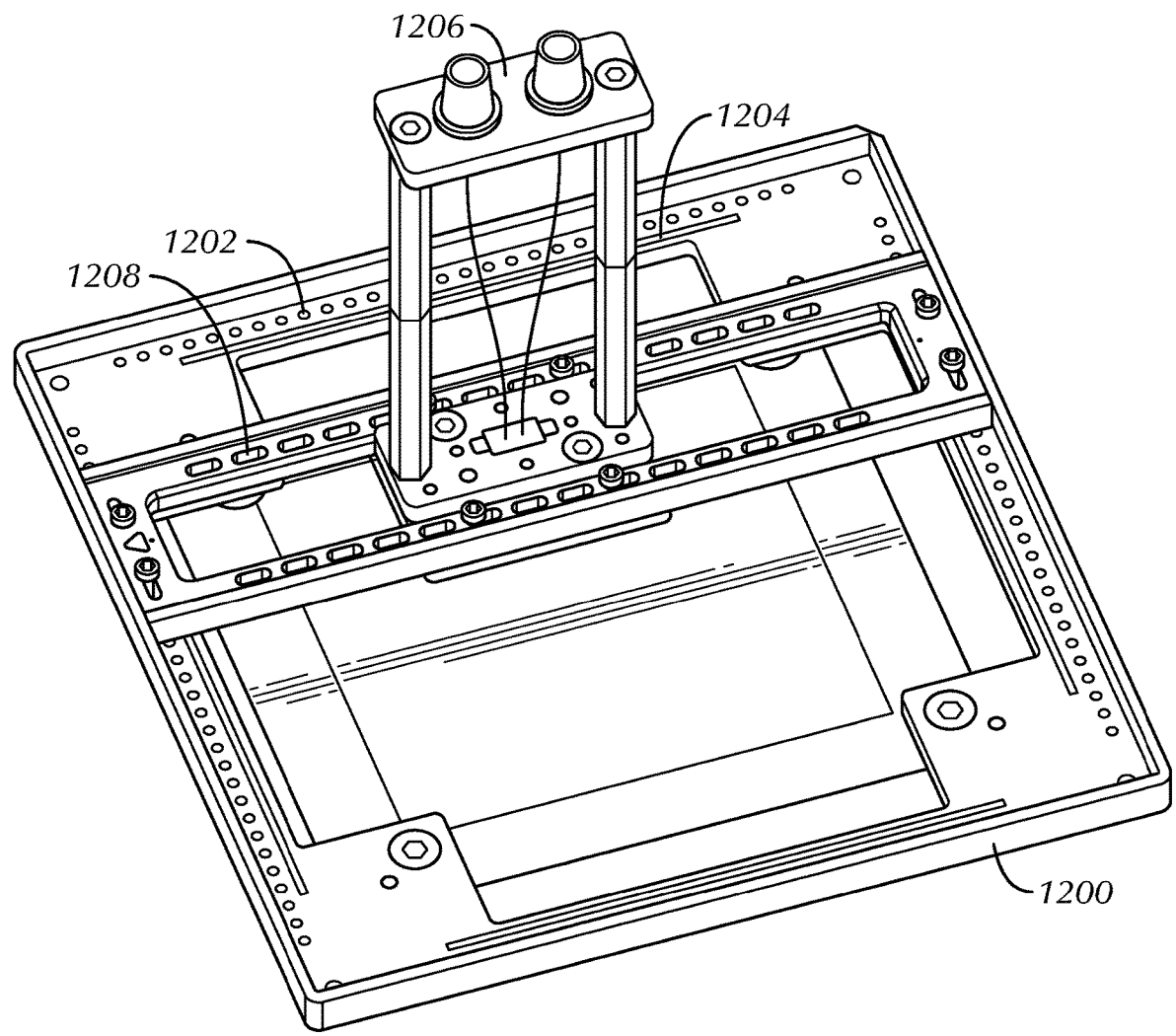
FIG. 12 shows a perspective view of a single piece base in accordance with one or more embodiments described herein.

FIG. 12 shows an alternate embodiment of the system of FIG. 1 in accordance with one or more embodiments described herein. As shown in FIG. 1, the system again includes first crossbar alignment features (1202), second crossbar alignment features (1204), first adapter plate alignment features (1208), and a measurement device (1206), each of which are substantially similar to like-named devices discussed above in the description of FIG. 1. Additionally, FIG. 12 shows a base (1200). In one or more embodiments, the system shown in FIG. 12 differs from that shown in FIG. 1, at least, because the base (1200) is a single piece of any shape and material that is configured to be removably coupled to an electrical component (e.g., a circuit board). In other words, the base (1200) is only a single piece of the system, rather than including a first base component and a second base component, as shown, for example, in FIG. 1.

While FIG. 12 shows a configuration of components, other configurations may be used without departing from the scope of embodiments described herein. Accordingly, embodiments disclosed herein should not be limited to the configuration of components shown in FIG. 12.

Figure 13:
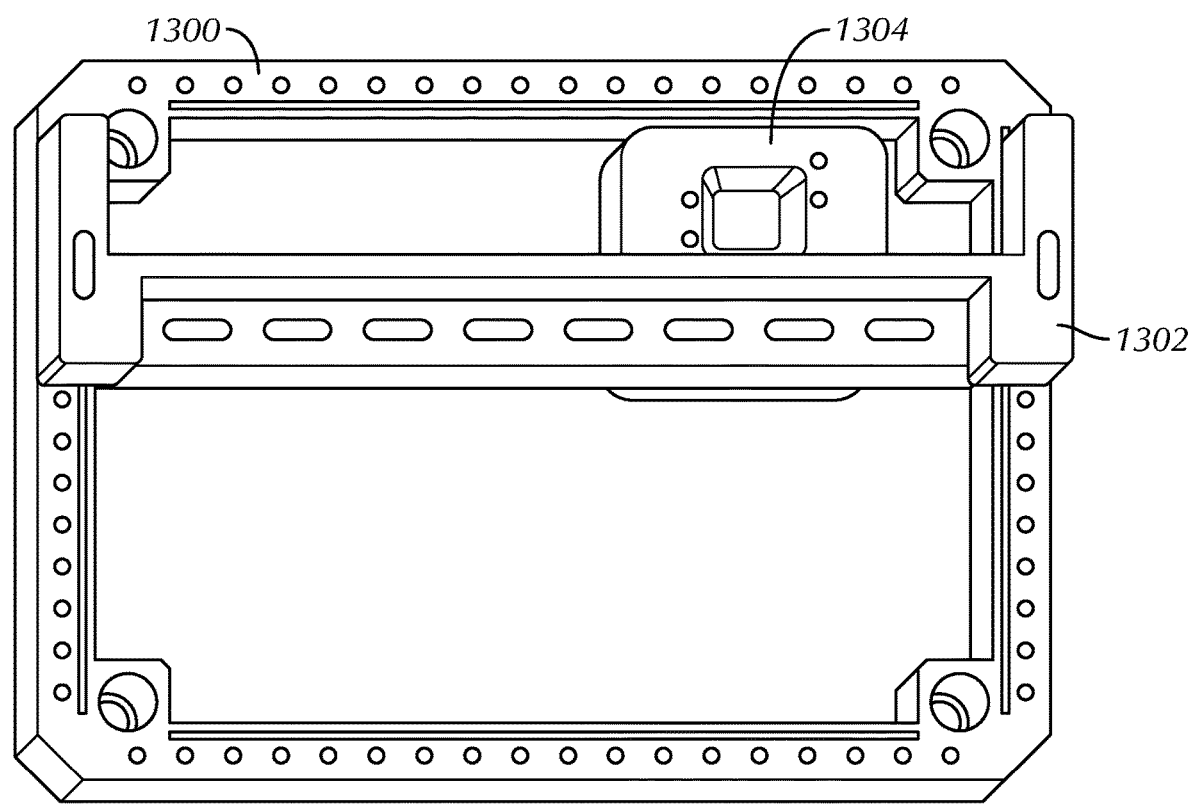
FIG. 13 shows a perspective view of a system in accordance with one or more embodiments described herein.
Figure 14:
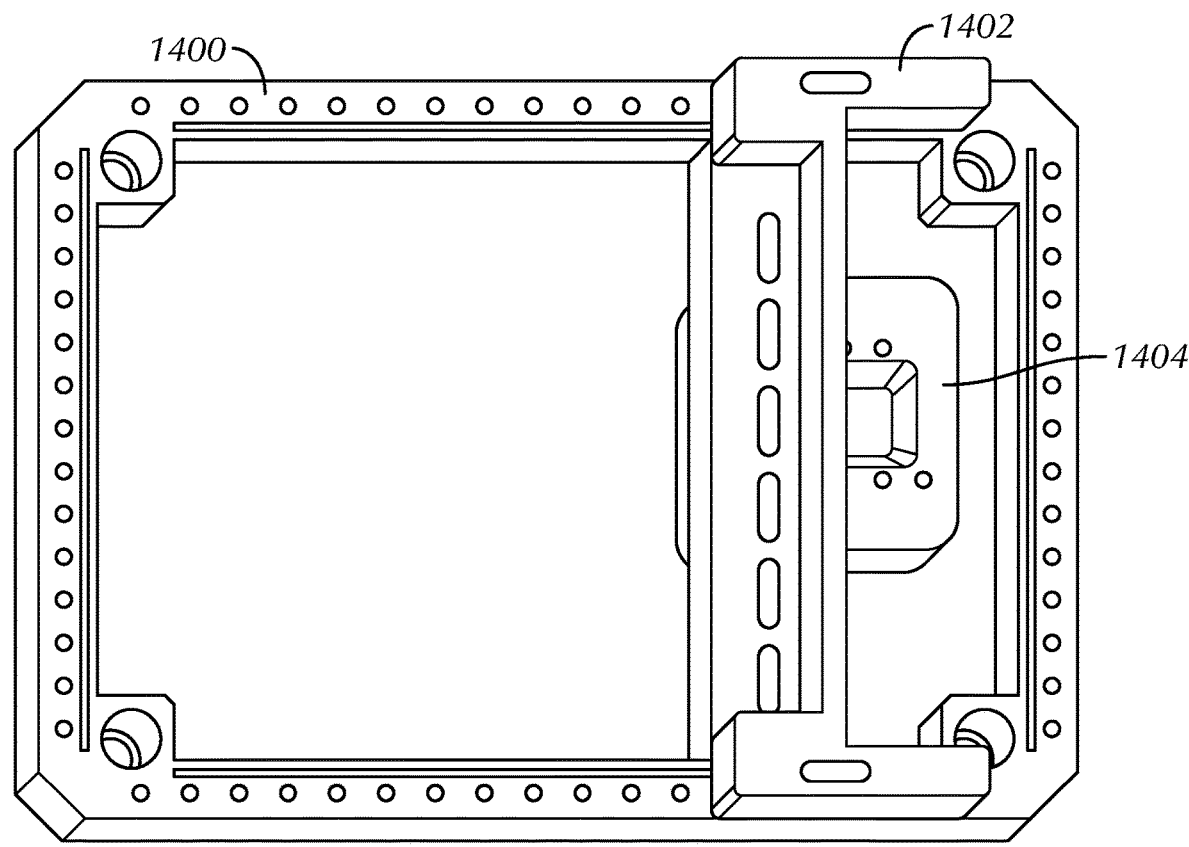
FIG. 14 shows a perspective view of a system in accordance with one or more embodiments described herein.

FIG. 13 and FIG. 14 show an alternate system in accordance with one or more embodiments described herein. Specifically, FIG. 13 and FIG. 14 each show a base (1300, 1400) that is a single piece of any shape and material that is configured to be removably coupled to an electrical component (e.g., a circuit board). Additionally, the base (1300, 1400) as shown in FIG. 13 and FIG. 14 is shown as being substantially rectangular rather than substantially square. Such a base (1300, 1400) may be useful, for example, when the underlying electrical component on which the system is to be mounted requires a different shape to fit properly. In one or more embodiments, because the lengths of the sides of the base (1300, 1400) differ, a set of system components to facilitate the base would include two crossbars (1302, 1402), each to be used when the crossbar is to be oriented in a direction with differing length requirements. As shown in FIG. 13, the crossbar (1302) is relatively longer to cross the distance from left to right of the base, while FIG. 14 shows a crossbar (1402) that is relatively shorter, to facilitate the shorter distance from top to bottom of the base. In either case, in one or more embodiments, an adapter plate (1304, 1404) is removably coupled to the crossbar (1302, 1402) in manners substantially similar to those described above.

While FIG. 13 and FIG. 14 each show a configuration of components, other configurations may be used without departing from the scope of embodiments described herein. Accordingly, embodiments disclosed herein should not be limited to the configuration of components shown in FIG. 13 and/or FIG. 14.

Figure 15:
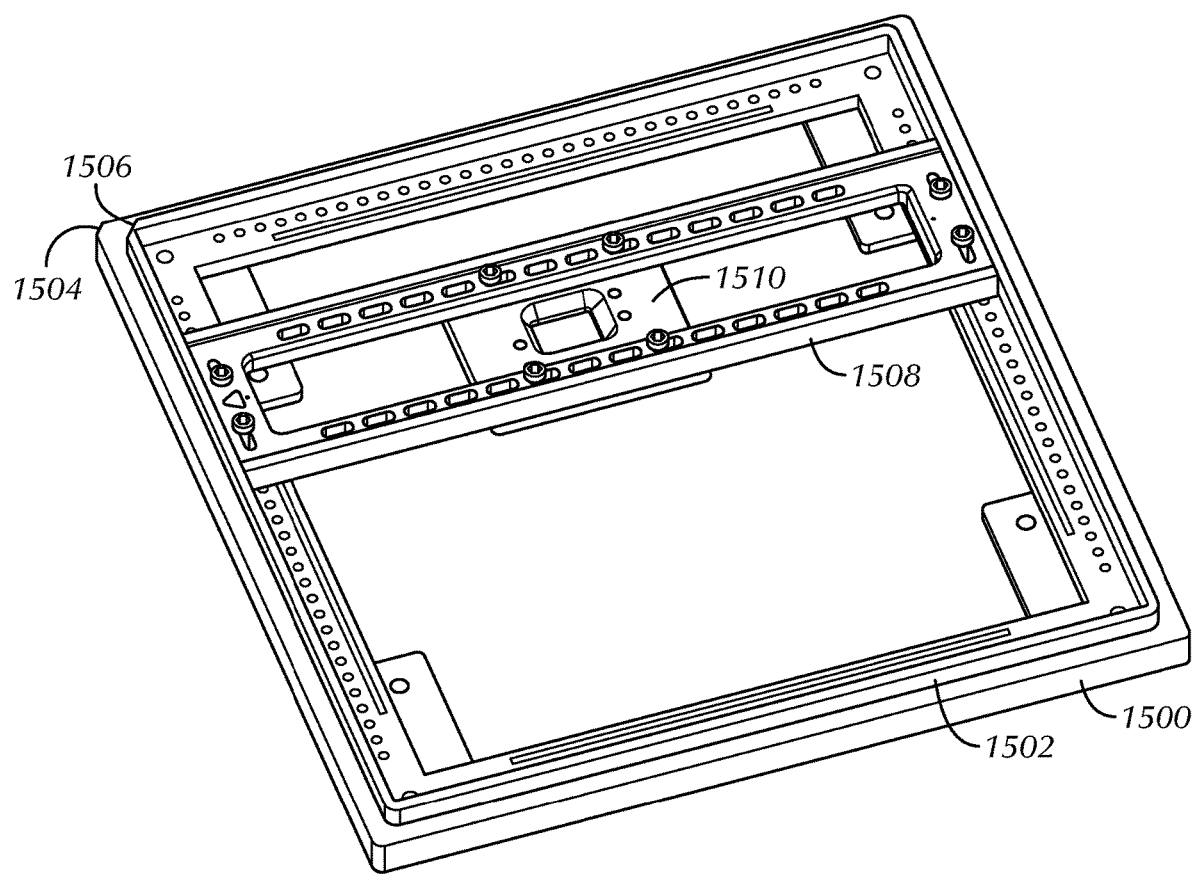
FIG. 15 shows a perspective view of base alignment features in accordance with one or more embodiments described herein.

FIG. 15 again shows a portion of a system in accordance with one or more embodiments described herein. As shown in FIG. 15, the system includes a first base component (1500), a second base component (1502), a crossbar (1508), and an adapter plate (1510), each of which is substantially similar to like-named components discussed above in the description of FIG. 1. FIG. 15 is intended to draw attention to an additional feature of the system. Specifically, FIG. 15 shows a first base component alignment feature (1504) and a second base component alignment feature (1506). In one or more embodiments, the first base component alignment feature (1504) is a feature of the first base component (1500) that differs from other aspects of the first base component (1500) in such a way as to allow for proper alignment of the first base component (1500) on the electrical component (not shown) to which the first base component (1500) is removably coupled. In the example shown in FIG. 15, the first base component alignment feature (1504) is a chamfered corner, which differs from the other corners of the first base component (1500), which are not so chamfered.

Such a first base component alignment (1504) feature may allow for proper alignment of the first base component (1500) relative to the electrical component (not shown) to which it is coupled. Similarly, to help ensure that the second base component (1502) is properly aligned relative to the first base component (1500), the second base component (1502) may also include a second base component alignment feature (1506). As shown in FIG. 15, the second base component alignment feature (1506) is a chamfered corner, which differs from the other corners of the second base component (1502), which are not so chamfered. Such a second base component alignment feature (1506) may allow for the second base component (1502) to be properly aligned relative to the first base component (1500) and, thereby, to the electrical component (not shown). Although FIG. 15 shows the first base component alignment feature (1504) and the second base component alignment feature (1506) to be in the same corner of the respective base components, one having ordinary skill in the art and the benefit of this Detailed Description will appreciate that the base component alignment features may or may not be co-located, and may take any form for allowing proper alignment of the base components relative to one another and to the electrical component.

While FIG. 15 shows a configuration of components, other configurations may be used without departing from the scope of embodiments described herein. Accordingly, embodiments disclosed herein should not be limited to the configuration of components shown in FIG. 15.

While embodiments described herein have been described with respect to a limited number of embodiments, those skilled in the art, having the benefit of this Detailed Description, will appreciate that other embodiments can be devised which do not depart from the scope of embodiments as disclosed herein. Accordingly, the scope of embodiments described herein should be limited only by the attached claims.

What is claimed is:

1. A system, comprising:
a base comprising a base mounting feature and configured to be removably coupled to an electrical component by a base mounting member inserted within the base mounting feature and a corresponding electrical component mounting feature to secure the base to the electrical component, the base comprising a first plurality of crossbar alignment features arranged in a first pattern, wherein:

the base is in direct physical contact with the electrical component, and the base is removably coupled to the electrical component using a plurality of heatsink mounting locations of the electrical component;

a crossbar configured to be removably coupled to the base using a portion of the first plurality of crossbar alignment features, the crossbar comprising a first plurality of adapter plate alignment features arranged in a second pattern, wherein:

the crossbar is in direct physical contact with the portion of the first plurality of crossbar alignment features and the base, the crossbar has a first length configured to allow the crossbar to be removably coupled to the base in a first orientation, and the system further comprises a second crossbar having a second length configured to allow the second crossbar to be removably coupled to the base in a second orientation; and an adapter plate configured to be removably coupled to the crossbar using a subset of the first plurality of adapter plate alignment features, the adapter plate comprising a plurality of measurement device mounting features, wherein the adapter plate is in direct physical contact with the first plurality of adapter plate alignment features and the crossbar.

2. The system of claim 1, wherein the base further comprises:

a plurality base corners; and a base corner comprising a first placement feature and configured to cause a valid placement of the base coupled to the electrical component.

3. The system of claim 1, wherein the base further comprises:

a first base component comprising a plurality of electrical component mounting features and a plurality of second base component mounting features; and a second base component configured to be removably coupled to the first base component using the plurality of second base component mounting features, the second base component comprising the first plurality of crossbar alignment features.

4. The system of claim 3, wherein:

the first base component further comprises:

a first plurality first base component corners; and a first base component placement feature configured to cause a valid placement of the first base component coupled to the electrical component, and the second base component further comprises:

a second plurality second base component corners; and a second base component placement feature configured to cause a valid alignment of the second base component with the first base component.

5. The system of claim 1, wherein the base further comprises:

a second plurality of crossbar alignment features arranged in a third pattern and configured to align the crossbar to electrical component features of the electrical component that are to be measured by a measurement device mounted to the adapter plate using a portion of the plurality of measurement device mounting features.

6. The system of claim 5, wherein the second plurality of crossbar alignment features are a plurality of holes configured to align the crossbar to the electrical component features using an alignment member inserted into a first hole of the plurality of holes and into a second hole in the crossbar.

7. The system of claim 1, wherein the crossbar further comprises:

a second plurality of adapter plate alignment features arranged in a third pattern and configured to align the crossbar to electrical component features of the electrical component that are to be measured by a measurement device mounted to the adapter plate using a portion of the plurality of measurement device mounting features.

8. The system of claim 7, wherein the second plurality of adapter plate alignment features are a plurality of holes configured to align the adapter plate to the electrical component features using an alignment member inserted into a first hole of the plurality of holes and into a second hole in the adapter plate.

9. The system of claim 1, wherein the base, the crossbar, and the adapter plate comprise a conductive material.

10. The system of claim 1, wherein a measurement device is operatively coupled to the electrical component in a perpendicular configuration by coupling the measurement device to the system using the plurality of measurement device mounting features.

11. The system of claim 10, wherein the measurement device comprises a spring loaded tip for the operative coupling to the electrical component.

12. The system of claim 10, wherein the measurement device is configured to measure a signal integrity between a plurality of measurement locations of the electrical component.

13. The system of claim 1, wherein the electrical component includes a printed circuit board (PCB).

14. The system of claim 1, wherein the electrical component comprises a plurality of measurement locations arranged in a grid pattern.

15. The system of claim 1, wherein the first plurality of crossbar alignment features each comprise two distal ends having a distance between the two distal ends that is greater than a diameter of a member configured to removably couple the crossbar to the base.

16. The system of claim 1, wherein the first plurality of adapter plate alignment features each comprise two distal ends having a distance between the two distal ends that is greater than a diameter of a member configured to removably couple the adapter plate to the crossbar.

17. The system of claim 1, wherein the base is one shape selected from a group of shapes consisting of a rectangle and a square.

* * * * *